(12) United States Patent
Hagio et al.

(10) Patent No.: US 9,146,458 B2
(45) Date of Patent: Sep. 29, 2015

(54) EUV MASK

(71) Applicant: KABUSHIKI KAISHA TOSHIBA, Tokyo (JP)

(72) Inventors: Yoshinori Hagio, Mie (JP); Yosuke Okamoto, Mie (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 199 days.

(21) Appl. No.: 13/798,301

(22) Filed: Mar. 13, 2013

(65) Prior Publication Data

US 2014/0192335 A1    Jul. 10, 2014

Related U.S. Application Data

(60) Provisional application No. 61/750,379, filed on Jan. 9, 2013.

(51) Int. Cl.
*G03F 1/22* (2012.01)
*G03F 1/24* (2012.01)
*G03F 1/72* (2012.01)

(52) U.S. Cl.
CPC .. *G03F 1/22* (2013.01); *G03F 1/24* (2013.01); *G03F 1/72* (2013.01)

(58) Field of Classification Search
CPC ..................................... G03F 1/22; G03F 1/24
USPC ................................................................ 430/5
See application file for complete search history.

(56) References Cited

U.S. PATENT DOCUMENTS 6,653,024 B1 * 11/2003 Shiraishi et al. ................. 430/5

FOREIGN PATENT DOCUMENTS

| JP | 2004-349544 A | 12/2004 |
|----|---------------|---------|
| JP | 2005-183612 A | 7/2005  |
| JP | 2007-078802 A | 3/2007  |

* cited by examiner

*Primary Examiner* — Christopher Young
(74) *Attorney, Agent, or Firm* — Posz Law Group, PLC

(57) ABSTRACT

An EUV exposure apparatus according to embodiments includes a reticle stage which suctions a rear surface side of an EUV mask to retain the EUV mask. In addition, the EUV exposure apparatus includes a detection unit which detects a position of a measurement mark formed on the rear surface of the EUV mask in the state where the EUV mask is suctioned on the reticle stage. In addition, the EUV exposure apparatus includes a control unit which calculates a distortion amount of the EUV mask based on the position of the measurement mark and performs exposure control on a wafer while correcting the distortion amount.

5 Claims, 5 Drawing Sheets

EUV MASK

CROSS-REFERENCE TO RELATED APPLICATIONS

This application is based upon and claims the benefit of priority from U.S. Provisional Application No. 61/750,379, filed on Jan. 9, 2013; the entire contents of which are incorporated herein by reference.

FIELD

The embodiments generally relates to an EUV exposure apparatus, an EUV mask, and a method of measuring distortion.

BACKGROUND

As one of lithography processes in a semiconductor process, there is a pattern transfer technique using an EUV (Extreme Ultra Violet) light beam. This technique has attracted attention as one of methods capable of forming finest patterns among recent lithography techniques.

In the lithography using an EUV light beam, since the EUV light beam may not transmit through glass, used is a reflection-type photomask (EUV mask) where the EUV light beam is reflected by an multi-layered film obtained by alternately forming Mo (molybdenum)/Si (silicon). In terms of the configuration of the apparatus, the rear surface side of the EUV mask is suctioned by using an electrostatic chuck method or the like, so that the EUV mask is retained inside the EUV exposure apparatus.

However, in the case where the rear surface side is suctioned, there are problems in that insertion of particles (fine dust) attached to the suction sites leads to a deterioration in flatness or in that a difference in suction force causes occurrence of horizontal distortion in the mask. Even in the case where the distortion occurs, if the amount of distortion can be accurately measured, the distortion amount is corrected and exposure can be performed. Therefore, it is preferable that the distortion amount be accurately measured.

DETAILED DESCRIPTION

According to embodiments, provided is an EUV exposure apparatus. The EUV exposure apparatus includes a reticle stage which retains an EUV mask by suctioning a rear surface side of the EUV mask. In addition, the EUV exposure apparatus includes a detection unit which detects a position of a measurement mark formed on the rear surface of the EUV mask in the state where the EUV mask is suctioned on the reticle stage. In addition, the EUV exposure apparatus includes a control unit which calculates a distortion amount of the EUV mask based on the position of the measurement mark and performs exposure control on a wafer while correcting the distortion amount.

Hereinafter, an EUV exposure apparatus, an EUV mask, a method of measuring distortion according to the embodiments will be described in detail with reference to the attached drawings. In addition, the present invention is not limited to the embodiments.

First Embodiment

Figure 1:
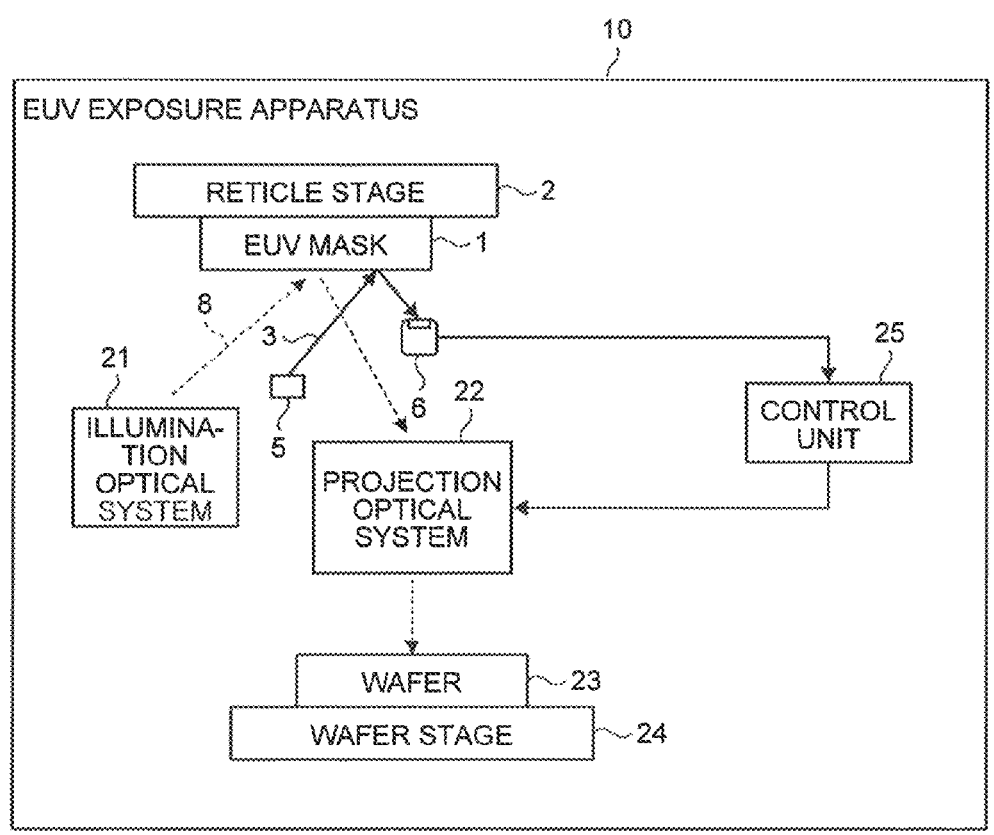
FIG. 1 is a diagram illustrating a configuration of an EUV exposure apparatus according to a first embodiment.

FIG. 1 is a diagram illustrating a configuration of an EUV exposure apparatus according to a first embodiment. The EUV exposure apparatus 10 is configured to include a reticle stage 2, an illumination optical system 21, a projection optical system 22, a wafer stage 24, a control unit 25, an inspection light source 5, and a mark detector 6.

The reticle stage 2 retains the EUV mask 1 by suctioning a rear surface side of the EUV mask 1. For example, the reticle stage 2 retains the EUV mask 1 by using an electrostatic chuck method.

At the time of exposing a wafer (substrate) 23, the reticle stage 2 moves the EUV mask 1 to the position where the EUV mask 1 is illuminated with an exposure light beam (EUV light beam) 8 illuminated from the illumination optical system 21. In addition, at the time of measuring the distortion of the EUV mask 1, the reticle stage 2 moves the EUV mask 1 to the position where the EUV mask 1 is illuminated with an inspection light beam 3 illuminated from the inspection light source 5.

The illumination optical system 21 illuminates the EUV mask 1 formed on a mask pattern with the exposure light beam 8 which is output from a light source (not illustrated). The EUV mask 1 is a reflection type photomask (reticle). A circuit pattern (mask pattern) is formed on the top surface of the EUV mask 1, and a measurement mark (measurement mark 4A described below) for measuring the distortion of the EUV mask 1 is formed on the bottom surface thereof. The EUV mask 1 is formed by using a flat member. The measurement mark 4A is formed on the rear surface (bottom surface) of the EUV mask 1 by using a metal film and the like which is suctioned on the reticle stage 2.

The projection optical system 22 reduces and projects the circuit pattern on the wafer 23 by illuminating the wafer 23 with the exposure light beam 8 reflected by the EUV mask 1. The wafer stage 24 allows the wafer 23 to be mounted thereon and moves the wafer 23 to the exposure position (shot position).

The inspection light source 5 illuminates the EUV mask 1 with the inspection light beam 3 for measuring the distortion amount of the EUV mask 1 suctioned on the reticle stage 2. The inspection light beam 3 is, for example, a laser beam having a wavelength of 900 nm or more. The inspection light source 5 illuminates each position of the measurement marks 4A with the inspection light beam 3.

The mark detector 6 is a sensor or the like which receives the inspection light beam 3 reflected by the rear surface of the EUV mask 1 and detects the positions of the measurement marks 4A based on a result of the light reception (intensity of the reflected light beam). The mark detector 6 receives the inspection light beam 3 with respect to each position of the measurement marks 4A to detect the position of each measurement mark 4A. Therefore, the mark detector 6 detects the position of the measurement mark 4A on the plane parallel to the rear surface of the EUV mask 1. The mark detector 6 transmits a result (mark position) of position detection with respect to each measurement mark 4A to the control unit 25.

The control unit 25 calculates the distortion amount (distortion distribution) on the surface (pattern formation surface), where the circuit pattern is formed, based on the result of position detection transmitted from the mark detector 6. The control unit 25 controls the projection optical system 22 based on the distortion amount. The control unit 25 adjusts the projection optical system 22 so as to remove the distortion of the pattern formation surface. In addition, the control unit 25 may correct the distortion of the pattern formation surface by adjusting the illumination optical system 21.

At the time of transferring the circuit pattern of the EUV mask 1 to the wafer 23, the reticle stage 2 suctions the rear surface side of the EUV mask 1. In this state, the reticle stage 2 is moved on the plane parallel to the pattern formation surface (in the X and Y directions described below) in order to measure the position of the measurement mark 4A. The reticle stage 2 is moved so that the inspection light source 5 can illuminate the measurement mark 4A with the inspection light beam 3 and the mark detector 6 can detect the position of the measurement mark 4A illuminated with the inspection light beam 3. Therefore, the inspection light source 5 and the mark detector 6 sequentially scan each inspection mark 4A.

The mark detector 6 transmits the detected mark positions to the control unit 25, and the control unit 25 calculates the distortion amount of the pattern formation surface based on the mark positions. Next, the control unit 25 corrects the distortion of the pattern formation surface by adjusting the projection optical system 22 based on the distortion amount. In other words, the control unit 25 transfers the circuit pattern of the EUV mask 1 to the wafer 23 while correcting the distortion of the pattern formation surface based on the distortion amount.

Figure 2:
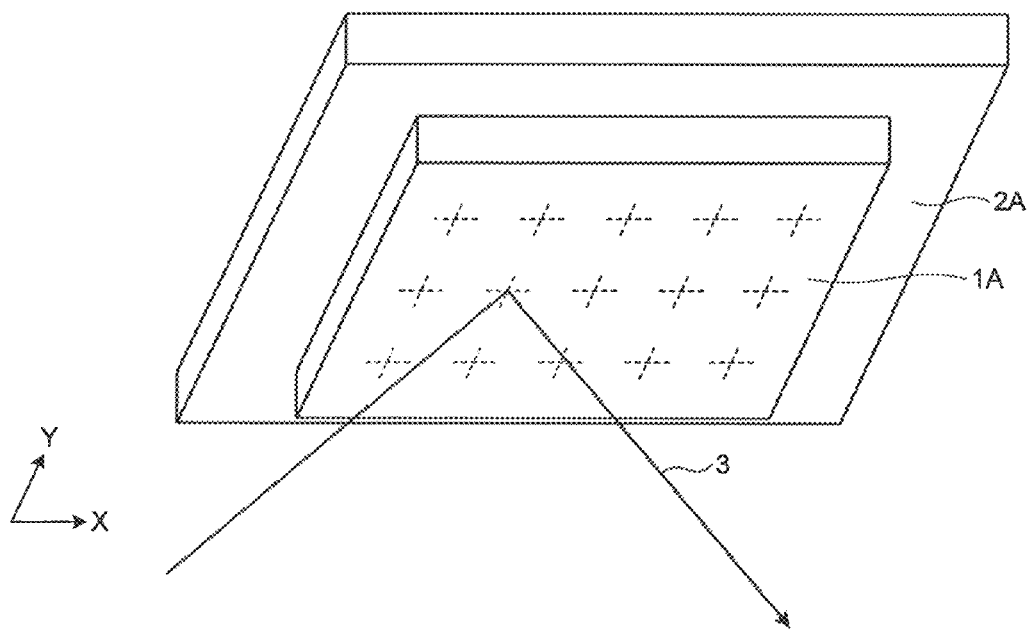
FIG. 2 is a perspective diagram illustrating a configuration of an EUV mask according to the first embodiment.

FIG. 2 is a perspective diagram illustrating a configuration of an EUV mask according to the first embodiment. FIG. 2 illustrates a configuration of an EUV mask 1A as an example of the EUV mask 1. In addition, the circuit pattern is not illustrated in FIG. 2.

The EUV mask 1A has a rectangular top surface where the circuit pattern is formed. In addition, the rectangular top surface has a side extending in the X direction as a first direction and a side extending in the Y direction as a second direction.

A plurality of the measurement marks 4A are arranged on the rear surface of the EUV mask 1A. For example, cross-shaped measurement marks 4A (position measurement slits) are formed on the rear surface of the EUV mask 1A in a matrix shape at equal intervals in the X and Y directions. Therefore, a plurality of the measurement marks 4A are arranged in each of the X and Y directions. In the embodiment, the measurement marks 4A are formed on the rear surface of the EUV mask 1 in order to arrange the measurement marks 4A on the entire surface of the EUV mask 1A irrespective of the arrangement of the circuit pattern. The bottom surface side of the EUV mask 1A is suctioned by a reticle stage 2A, and the top surface side thereof is illuminated with the inspection light beam 3.

Figure 3:
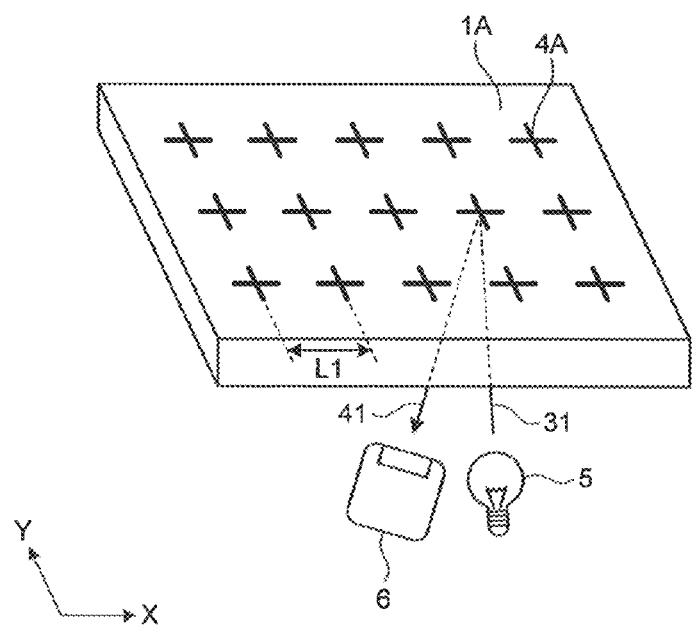
FIG. 3 is a diagram illustrating a position detection method for a measurement mark according to the first embodiment.

FIG. 3 is a diagram illustrating a position detection method for a measurement mark according to the first embodiment. The inspection light source 5 is arranged at the position where the top surface of the EUV mask 1A can be illuminated with the inspection light beam 3 in the state where the EUV mask 1A is suctioned on the reticle stage 2A. In addition, the mark detector 6 is arranged at the position where the positions of the measurement marks 4A on the EUV mask 1A can be detected in the state where the EUV mask 1A is suctioned on the reticle stage 2A.

In addition, the inspection light source 5 and the mark detector 6 are arranged at the positions where the exposure light beam 8 illuminated from the illumination optical system 21 on the EUV mask 1A and the exposure light beam 8 reflected by the EUV mask 1A are not blocked. For example, the inspection light source 5 is arranged at the position where the inspection light beam 3 can be incident in the direction perpendicular to the top surface of the EUV mask 1A.

In FIG. 3, the inspection light beam 3 illuminated from the inspection light source 5 is illustrated as an inspection light beam 31, and the inspection light beam 3 (reflected light beam) reflected by the EUV mask 1A is illustrated as an inspection light beam 41. At the time of measuring the positions of the measurement marks 4A, the inspection light source 5 sequentially illuminates the vicinity of the measurement marks 4A with the inspection light beam 31.

For example, the inspection light source 5 sequentially illuminates the rear surface of the EUV mask 1 with the inspection light beam 31 in the X direction. Therefore, the inspection light source 5 sequentially illuminates the measurement marks 4A, which are arranged at a predetermined interval (for example, an interval L1) in the X direction, with the inspection light beam 31.

Similarly, for example, the inspection light source 5 sequentially illuminates the rear surface of the EUV mask 1 with the inspection light beam 31 in the Y direction. Therefore, the inspection light source 5 sequentially illuminates the measurement marks 4A, which are arranged at a predetermined interval (for example, the interval L1) in the Y direction, with the inspection light beam 31.

In the case where N (N is a natural number) columns of the measurement marks 4A are aligned in the X direction, the inspection light source 5 scans the rear surface of the EUV mask 1 N times in the X direction with the inspection light beam 31. Similarly, in the case where M (M is a natural number) columns of the measurement marks 4A are aligned in the Y direction, the inspection light source 5 scans the rear surface of the EUV mask 1 M times in the Y direction with the inspection light beam 31.

The mark detector 6 sequentially detects the positions of the measurement marks 4A illuminated with the inspection light beam 31. At this time, the mark detector 6 detects the position of each measurement mark 4A based on a signal intensity of the inspection light beam 41.

Figure 4:
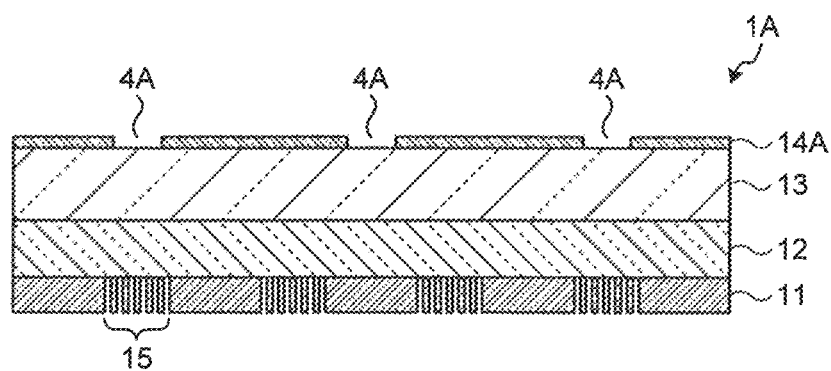
FIG. 4 is a diagram illustrating a configuration of a cross section of the EUV mask according to the first embodiment.

FIG. 4 is a diagram illustrating a configuration of a cross section of the EUV mask according to the first embodiment. In the EUV mask 1A, a Mo/Si multi-layered film (molybdenum/silicon) 12 is laminated on the one surface (top surface) of a glass blank 13. In addition, in the EUV mask 1A, circuit patterns 15 and the like are formed on the Mo/Si multi-layered film 12 by using a material (light absorption layer 11) absorbing an EUV light beam.

A metal film 14A made of Cr (chromium) or the like is vapor-deposited on the other surface (rear surface) of the glass blank 13, and the measurement marks 4A are formed by using the metal film 14A. More specifically, the shapes of the measurement marks 4A are cut out from the metal film 14A, and the glass blank 13 is exposed in the shapes of the measurement marks 4A, so that the measurement marks 4A are formed. In other words, the measurement marks 4A are interstices which are formed by cutting out the shapes of the measurement marks 4A.

When the EUV mask 1A is illuminated with the inspection light beam 31 from the inspection light source 5, a portion of the inspection light beam 31 is absorbed by the light absorption layer 11. The non-absorbed portion of the inspection light beam 31 is reflected by the Mo/Si multi-layered film 12 on the surface of the EUV mask 1A. In addition, the metal film 14A on the rear surface of the EUV mask 1A is illuminated with the portion of the inspection light beam 31 that is not reflected by the Mo/Si multi-layered film 12 and transmits through the Mo/Si multi-layered film 12 and the glass blank 13. At this time, the inspection light beam 31 is reflected at the positions where the measurement marks 4A are not formed, and the inspection light beam 31 is transmitted at the positions where the measurement marks 4A are formed.

The portion of the inspection light beam 31 that is reflected by the measurement mark 4A transmits through the glass blank 13 and the Mo/Si multi-layered film 12 again as the inspection light beam 41. In addition, the portion of the transmitted inspection light beam 41 that is not absorbed by the light absorption layer 11 is emitted from the top surface of the EUV mask 1A to reach the mark detector 6.

Since measurement mark 4A is formed on the rear surface of the EUV mask 1A, although the inspection light beam 31 reaches the rear surface of the EUV mask 1A, the inspection light beam 31 which is incident on the measurement mark 4A is not reflected. On the other hand, the inspection light beams 31 that are incident on the positions except for the measurement marks 4A on the rear surface (metal film 14A) of the EUV mask 1A are reflected by the metal film 14A.

Therefore, by scanning the EUV mask 1A in the direction perpendicular to the incidence direction of the inspection light beam 31, the intensity of the rear-surface-reflected light beam (inspection light beam 41) can be detected. Since the intensity of the inspection light beam 41 is determined according to the position of the measurement mark 4A, the position of the measurement mark 4A can be detected by detecting the signal intensity of the inspection light beam 41.

In addition, a light absorption layer may be arranged on the surface (suctioning surface) of the reticle stage 2 so that the inspection light beam 31 incident on the measurement marks 4A is not reflected by the reticle stage 2.

Figure 5:
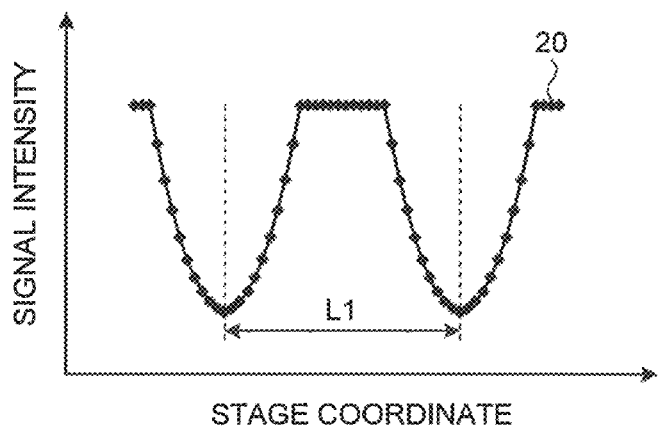
FIG. 5 is a diagram illustrating an example of a signal intensity of an inspection light beam.

FIG. 5 is a diagram illustrating an example of a signal intensity of the inspection light beam. In FIG. 5, the horizontal axis indicates a stage coordinate, and the vertical axis indicates a signal intensity. When position measurement is sequentially performed on the measurement marks 4A formed on the rear surface of the EUV mask 1A, the position where the signal intensity of the inspection light beam 41 is high and the position where the signal intensity thereof is low alternately appear according to the distance between the measurement marks 4A.

More specifically, the signal intensity of the inspection light beam 41 is low at the position (stage coordinate) where the measurement mark 4A is arranged. On the other hand, the signal intensity of the inspection light beam 41 is high at the position (stage coordinate) where the measurement mark 4A is not arranged.

For example, in the case where the measurement marks 4A are arranged at an interval L1 in the X direction, if no distortion occurs in the EUV mask 1A, the bottoms of the signal intensity waveform appear at the interval L1 in the X direction. Similarly, in the case where the measurement marks 4A are arranged at the interval L1 in the Y direction, if no distortion occurs in the EUV mask 1A, the bottoms of the signal intensity waveform appear at the interval L1 in the Y direction.

In the case where distortion occurs in the EUV mask 1A, the bottoms of the signal intensity waveform appear at intervals different from the interval L1. More specifically, the bottoms of the signal intensity waveform appear in a waveform according to the distortion amount of the EUV mask 1A. The EUV exposure apparatus 10 calculates the distortion amount of the EUV mask 1A by measuring the interval (bottom-bottom distance in the waveform) of the measurement marks 4A in the X direction and the interval (bottom-bottom distance in the waveform) of the measurement marks 4A in the Y direction.

In the embodiment, the positions of the measurement marks 4A arranged on the rear surface of the EUV mask 1A in a matrix shape are measured by scanning the EUV mask 1A in the state where the EUV mask LA is suctioned on the reticle stage 2. Therefore, the control unit 25 can calculate a positional relation between the measurement marks 4A with respect to the EUV mask 1A in the state where the EUV mask 1A is suctioned on the reticle stage 2. For example, the control unit 25 can approximately calculate the distortion amount of the EUV mask 1A in the state where the EUV mask 1A is suctioned on the mask stage by allowing the calculated positional relation to be approximate to a first-order polynomial or a higher-order polynomial.

Every time when the EUV mask 1A is allowed to be suctioned on the reticle stage 2, the EUV exposure apparatus 10 calculates the distortion amount of the EUV mask 1A to correct the distortion amount and performs an exposure process on the wafer 23. For example, the distortion amount calculation process and the exposure process performed by the EUV exposure apparatus 10 are performed with respect to each layer in the wafer process. More specifically, exposure is performed on the wafer 23, where resist is coated, by using the EUV mask 1A, and after that, development is performed on the wafer 23, so that a resist pattern is formed on the wafer 23. Next, etching is performed on the lower layer side of the resist pattern by using the resist pattern as a mask. Therefore, a real pattern corresponding to the resist pattern is formed on the wafer 23. In the manufacturing of a semiconductor device (semiconductor integrated circuit), the distortion amount calculation process, the exposure process with correction of the distortion amount, the development process, the etching process, and the like described above are repetitively performed on each layer. In addition, as a lithography process, an NIL (Nanoimprint Lithography) or the like may be used.

In addition, the shape of the measurement mark 4A is not limited to the cross shape, but it may be any shape. For example, the measurement mark 4A may have a rectangular ring shape having sides parallel to the X direction and sides parallel to the Y direction. In addition, the measurement mark 4A may have a shape of a combination of one more pairs of two perpendicular straight-line patterns (for example, an L shape or a T shape). In addition, in the embodiment, although the case where the measurement marks 4A are arranged in the equal intervals in the X and Y directions is described above, the measurement marks 4A may be arranged at any positions.

In addition, in the embodiment, although the case where the distortion amount of the EUV mask 1A is calculated based on the position of the measurement mark 4A in the X and Y directions is described above, the distortion amount of the EUV mask 1A may be calculated based on the focus value (the position in the Z direction) of the measurement mark 4A. In addition, the distortion amount of the EUV mask 1A may be calculated based on the position of the measurement mark 4A in the X, Y, and Z directions.

In addition, in the embodiment, when the position of the measurement mark 4A is to be measured, although the case where the reticle stage 2 is moved in the X and Y directions is described above, the inspection light source 5 and the mark detector 6 may be moved in the X and Y directions.

In this manner, according to the first embodiment, the measurement marks 4A are formed on the rear surface of the EUV mask 1A, and the EUV exposure apparatus 10 includes the inspection light source 5 and the mark detector 6, so that it is possible to accurately measure the distortion amount of the EUV mask 1A.

Second Embodiment

Next, a second embodiment will be described with reference to FIG. 6. In the second embodiment, the inspection light beam 3 is incident on a side surface of the EUV mask 1A to detect the position of the measurement mark.

Figure 6:
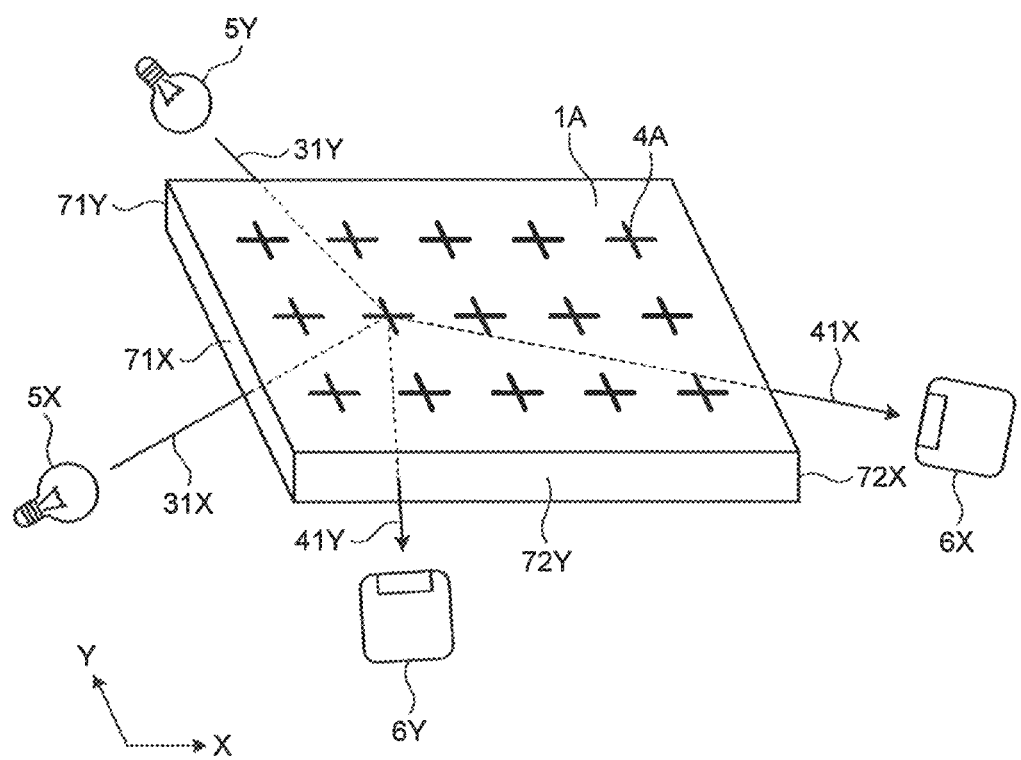
FIG. 6 is a diagram illustrating a position detection method for a measurement mark according to a second embodiment.

FIG. 6 is a diagram illustrating a position detection method for a measurement mark according to the second embodiment. The elements illustrated in FIG. 6 having the same functions as those of the EUV mask 1A and the EUV exposure apparatus 10 according to the first embodiment illustrated in FIG. 3 and the like are denoted by the same reference numerals, and the redundant description thereof is not made.

In the embodiment, the EUV exposure apparatus 10 includes inspection light sources 5X and 5Y instead of the inspection light source 5 and includes mark detectors 6X and 6Y instead of the mark detector 6. In addition, the inspection light beam 3 used in the embodiment is a light beam having a wavelength of, for example, 200 nm or more. In addition, if the inspection light beam 3 can transmit through the glass blank 13, the inspection light beam 3 may have any wavelength.

The inspection light source 5X illuminates the rear surface of the EUV mask 1A with the inspection light beam 3 from the first side surface 71X of the EUV mask 1A perpendicular to the X direction, and the inspection light source 5Y illuminates the rear surface of the EUV mask 1A with the inspection light beam 3 from the second side surface 71Y of the EUV mask 1A perpendicular to the Y direction. In FIG. 6, the inspection light beam 3 illuminated from the inspection light source 5X is illustrated as an inspection light beam 31X, and the inspection light beam 3 illuminated from the inspection light source 5Y is illustrated as an inspection light beam 31Y.

The inspection light beam 31X illuminated from the inspection light source 5X is reflected by the rear surface of the EUV mask 1A to be emitted from a third side surface 72X of the EUV mask 1A perpendicular to the X direction. In FIG. 6, the inspection light beam 3 (reflected light beam) which is illuminated from the inspection light source 5X and is reflected by the EUV mask 1A is illustrated as an inspection light beam 41X. The mark detector 6X receives the inspection light beam 41X emitted from the side surface 72X and detects the positions of the measurement marks 4A based on a result of the light reception.

The inspection light beam 31Y illuminated from the inspection light source 5Y is reflected by the rear surface of the EUV mask 1A to be emitted from a fourth side surface 72Y of the EUV mask 1A perpendicular to the Y direction. In FIG. 6, the inspection light beam 3 (reflected light beam) which is illuminated from the inspection light source 5Y and is reflected by the EUV mask 1A is illustrated as an inspection light beam 41Y. The mark detector 6Y receives the inspection light beam 41Y emitted from the side surface 72Y and detects the positions of the measurement marks 4A based on a result of the light reception.

The inspection light source 5X and the mark detector 6X and the inspection light source 5Y and the mark detector 6Y are arranged so that orthographic projections of the inspection light beams 3 facing the surface of the EUV mask 1A are perpendicular to each other.

In other words, in the case where the inspection light sources 5X and 5Y illuminates the rear surface of the EUV mask 1A with the inspection light beams 3 in the first and second directions, the inspection light sources 5X and 5Y are arranged so that the first and second directions are perpendicular to each other on the plane parallel to the rear surface of the EUV mask 1A.

In addition, the inspection light source 5X allows the inspection light beam 31X to be incident on the EUV mask 1 at such an angle that the inspection light beams 31X and 41X pass through a glass blank 13 and is not incident on a Mo/Si multi-layered film 12. Similarly, the inspection light source 5Y allows the inspection light beam 31Y to be incident on the EUV mask 1 at such an angle that the inspection light beams 31Y and 41Y pass through the glass blank 13 and is not incident on the Mo/Si multi-layered film 12.

In this manner, since the inspection light beam 3 is allowed to be incident on the side surface of the EUV mask 1A and to be emitted from the side surface, the inspection light beam 3 does not transmit through the Mo/Si multi-layered film 12 formed on the EUV mask 1A. Therefore, as a wavelength of the inspection light beam 3, a wavelength range of transmitting through the glass blank 13 can be selected. Accordingly, a visible light beam or a near ultraviolet light beam of which resolution is higher than that of an infrared light beam may be used.

In addition, since two sets of light sources and detectors, that is, a set of the inspection light source 5X and the mark detector 6X and a set of the inspection light source 5Y and the mark detector 6Y are arranged, the positions of the measurement marks 4A can be detected without a decrease in positional resolution of the measurement marks 4A.

The mark detectors 6X and 6Y receives the inspection light beams 41X and 41Y at each position of the measurement marks 4A and detects the positions of the measurement marks 4A. The mark detectors 6X and 6Y transmits a result of detection of the positions of the measurement marks 4A to the control unit 25.

In addition, the inspection light sources 5X and 5Y or the mark detectors 6X and 6Y are arranged at the positions where the exposure light beam 8 illuminated from the illumination optical system 21 on the EUV mask 1A or the exposure light beam 8 reflected by the EUV mask 1A is not blocked.

In this manner, according to the second embodiment, since the inspection light beam 3 is allowed to be incident from the side surface of the EUV mask 1A and is allowed to be emitted as a reflected light beam from the side surface of the EUV mask 1A, the inspection light beam 3 does not need to transmit through the Mo/Si multi-layered film 12. Therefore, a degree of freedom in selection of light wavelength used for the inspection light beam 3 is increased.

Third Embodiment

Next, a third embodiment will be described with reference to FIGS. 7 and 8. In the third embodiment, the inspection light beam 3 is incident on the rear surface of an EUV mask to detect the position of the measurement mark.

Figure 7:
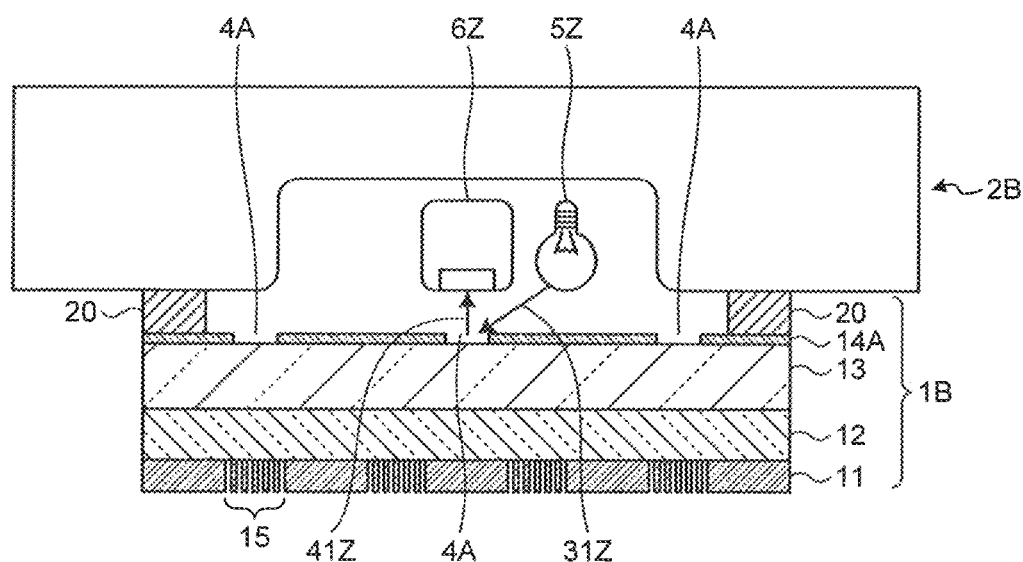
FIG. 7 is a diagram illustrating a configuration of a cross section of an EUV mask and a reticle stage according to a third embodiment.
Figure 8:
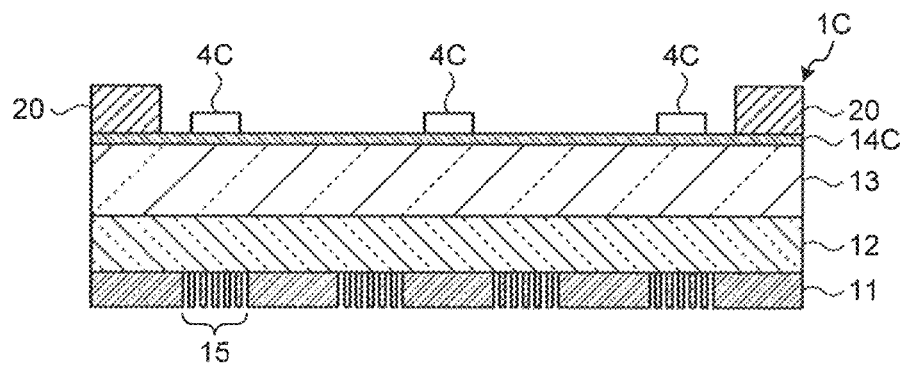
FIG. 8 is a diagram illustrating another example of a configuration of the EUV mask according to the third embodiment.

FIG. 7 is a diagram illustrating a configuration of a cross section of an EUV mask and a reticle stage according to a third embodiment. The elements illustrated in FIG. 7 having the same functions as those of the EUV mask 1A and the EUV exposure apparatus 10 according to the first embodiment illustrated in FIGS. 3 and 4 and the like are denoted by the same reference numerals, and the description thereof is not provided.

In the embodiment, the EUV exposure apparatus 10 includes an inspection light source 5Z instead of the inspection light source 5 and includes a mark detector 6Z instead of the mark detector 6. In addition, the EUV exposure apparatus 10 includes a reticle stage 2B instead of the reticle stage 2A. In addition, the EUV exposure apparatus 10 performs the distortion amount calculation process and the exposure process by using the EUV mask 1B instead of the EUV mask 1A. In addition, in the embodiment, the inspection light beam 3 may have any wavelength.

The EUV mask B1 includes the glass blank 13, the Mo/Si multi-layered film 12, and the light absorption layer 11 which are the same as those of the EUV mask 1A. The reticle stage 2B is provided with a space where the inspection light source 5Z and the mark detector 6Z are contained. The inspection light source 5Z and the mark detector 6Z are arranged on the surface of the reticle stage 2B where the EUV mask 1B is suctioned.

In the reticle stage 2B, since the EUV mask 1B may not be suctioned at the sites where the inspection light source 5Z and the mark detector 6Z are arranged, the EUV mask 1B is suctioned at the sites where the inspection light source 5Z or the mark detector 6Z is not arranged. Therefore, a suction portion 20 for suctioning the EUV mask 1B on the reticle stage 2B is formed on the rear surface side of the EUV mask 1B by using a metal member or the like. For example, the suction portion 20 is formed with a predetermined height in an outer periphery portion of the EUV mask 1B. The measurement marks 4A are arranged in an area inside the suction portion 20.

According to this configuration, the inspection light source 5Z illuminates the EUV mask 1B with the inspection light beam 3 from the rear surface side of the EUV mask 1B suctioned on the reticle stage 2B. In FIG. 7, the inspection light beam 3 which is illuminated from the inspection light source 5Z is illustrated as an inspection light beam 31Z.

The inspection light beam 31Z illuminated from the inspection light source 5Z is reflected by the rear surface of the EUV mask 1B. In FIG. 7, the inspection light beam 3 (reflected light beam) which is illuminated from the inspection light source 5Z and is reflected by the EUV mask 1B is illustrated as an inspection light beam 41Z. The mark detector 6Z receives the inspection light beam 41Z reflected by the rear surface of the EUV mask 1B and detects the positions of the measurement marks 4A based on a result of the light reception.

In addition, an absorption layer may be arranged between the metal film 14A and the glass blank 13 in the EUV mask 1B. Therefore, among the inspection light beams 31Z illuminated on the EUV mask 1B, the inspection light beam 31Z illuminated on the measurement marks 4A can be efficiently absorbed by the lower layer side of the measurement marks 4A.

The mark detector 6Z receives the inspection light beam 41Z at each position of the measurement marks 4A and detects the positions of the measurement marks 4A based on a result of the light reception. The mark detector 6Z transmits a result of position detection with respect to each measurement mark 4A to the control unit 25.

In addition, the embodiment is not limited to the configuration where the measurement mark 4A is formed by using the metal film 14A, but the measurement mark 4A may be formed by using other members. FIG. 8 is a diagram illustrating another example of a configuration of the EUV mask according to the third embodiment. FIG. 8 illustrates a configuration of a cross section of the EUV mask 1C. The elements illustrated in FIG. 8 having the same functions as those of the EUV mask 1B illustrated in FIG. 7 are denoted by the same reference numerals, and the redundant description thereof is not provided.

The EUV mask 1C is configured to include a metal film 14C, a glass blank 13, an Mo/Si multi-layered film 12, a light absorption layer 11, and measurement marks 4C. The metal film 14C is formed by using the same members as those of the metal film 14A. In the embodiment, the measurement marks 4C are formed on the outer layer side from the metal film 14C by using members different from those of the metal film 14C. For example, the measurement marks 4C are formed by using members having optical properties (reflectance and the like) different from those of the metal film 14C. More specifically, the measurement marks 4C are formed by using members absorbing the inspection light beam 31Z.

In addition, with respect the EUV mask 1C, the positions of the measurement marks 4C may be detected by using the methods described in the first and second embodiments. In this case, the inspection light beam 3 and the measurement marks 4C are used so that a portion of the inspection light beam 3 is reflected by the metal film 14C and remaining non-reflected portion thereof transmits through the metal film 14C and so that the transmitted inspection light beam 3 is absorbed by the measurement mark 4C.

In this manner, according to the third embodiment, since the inspection light beam 3 is allowed to be incident from the rear surface of the EUV mask 1A and the reflected light beam is detected, the inspection light beam 3 does not need to transmit through the EUV masks 1B and 1C. Therefore, a degree of freedom in selection of light wavelength used for the inspection light beam 3 is increased.

In this manner, according to the first to third embodiments, since the distortion amount of the EUV mask is calculated based on the positions of the measurement marks in the state where the EUV mask is suctioned on the reticle stage, it is possible to accurately measure the distortion amount.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An EUV mask comprising:
   a circuit pattern that is formed on a front surface side of the EUV mask opposite to a surface side of the EUV mask suctioned on a reticle stage; and
   a measurement mark that is formed on a rear surface side of the EUV mask that is the surface side suctioned on the reticle stage and of which position is detected in a state in which the EUV mask is suctioned on the reticle stage, wherein a plurality of the measurement marks are arranged, at equal intervals in a first direction and in a second direction, on an entire surface of the rear surface side of the EUV mask.

2. The EUV mask according to claim 1, further comprising a metal film which is formed on the rear surface side of the EUV mask and is suctioned on the reticle stage,
wherein the measurement mark is formed by cutting the metal film.

3. The EUV mask according to claim 1, further comprising a suction portion which is formed in an outer periphery portion of the rear surface side of the EUV mask to be suctioned on the reticle stage,
wherein the measurement mark is arranged inside the suction portion.

4. The EUV mask according to claim 3, further comprising a metal film that is formed on the rear surface side of the EUV mask,
wherein the measurement mark is formed on an outer layer side of the metal film by using a member different from that of the metal film.

5. The EUV mask according to claim 1, wherein the measurement mark has a shape of a combination of one or more pairs of two perpendicular straight-line patterns.

* * * * *